(12) United States Patent
Moeck

(10) Patent No.: US 8,992,044 B2
(45) Date of Patent: Mar. 31, 2015

(54) OPTOELECTRONIC MODULE

(75) Inventor: Martin Moeck, Regensburg (DE)

(73) Assignee: OSRAM GmbH, Munich (DE)

( * ) Notice: Subject to any disclaimer, the term of this patent is extended or adjusted under 35 U.S.C. 154(b) by 75 days.

(21) Appl. No.: 13/202,971

(22) PCT Filed: Feb. 11, 2010

(86) PCT No.: PCT/EP2010/051724
§ 371 (c)(1),
(2), (4) Date: Dec. 5, 2011

(87) PCT Pub. No.: WO2010/094617
PCT Pub. Date: Aug. 26, 2010

(65) Prior Publication Data
US 2012/0134147 A1    May 31, 2012

(30) Foreign Application Priority Data

Feb. 23, 2009   (DE) .......................... 10 2009 010 213

(51) Int. Cl.
*F21V 7/00* (2006.01)
*F21V 7/04* (2006.01)
(Continued)

(52) U.S. Cl.
CPC ... *F21V 7/04* (2013.01); *F21K 9/00* (2013.01); *F21V 29/006* (2013.01); *F21V 29/2293* (2013.01); *F21Y 2111/005* (2013.01); *F21Y 2101/02* (2013.01)
USPC ........... 362/247; 362/231; 362/235; 362/236; 362/241; 362/249.01; 362/249.02

(58) Field of Classification Search
USPC ............ 362/231, 235, 236, 241, 247, 249.01, 362/249.02
See application file for complete search history.

(56) References Cited

U.S. PATENT DOCUMENTS 1,915,842 A * 6/1933 Winkler ........................ 362/348
4,484,254 A   11/1984 Puckett et al.
(Continued)

FOREIGN PATENT DOCUMENTS

DE   69306562   5/1997
DE   196 24 087   12/1997
(Continued)

OTHER PUBLICATIONS

Burstyn H. C. et al.: "The Design of High-Efficiency High-Resolution Projectors with the Digital Micromirror Device", SID '94 International Symposium Digest of Technical Papers (Society for Information Display, Santa Ana, Calif.), pp. 677-680 (1994).
(Continued)

*Primary Examiner* — Thomas A Hollweg
(74) *Attorney, Agent, or Firm* — Cozen O'Connor

(57) ABSTRACT

An optoelectronic module (1) having a reflector (4), which comprises an aperture (40) and a structured reflector surface (41), and having at least two connection carriers (3), on each of which there is arranged at least one component (2) provided for producing radiation. The connection carriers are arranged in the interior of the reflector. At least two components of the module exhibit different emission characteristics when the module is in operation, a main emission direction being assigned to each of the two components. The radiation emitted by the components in their respective main emission directions is deflected at least in part in the direction of the aperture by means of the structured reflector surface.

11 Claims, 5 Drawing Sheets

(51) Int. Cl.
*F21K 99/00* (2010.01)
*F21V 29/00* (2006.01)
*F21Y 111/00* (2006.01)
*F21Y 101/02* (2006.01)

(56) References Cited

U.S. PATENT DOCUMENTS

| | | | |
|---|---|---|---|
| 4,864,476 A * | 9/1989 | Lemons et al. | 362/348 |
| 5,255,171 A | 10/1993 | Clark | |
| 6,102,555 A | 8/2000 | Mizoguchi | |
| 6,149,283 A * | 11/2000 | Conway et al. | 362/236 |
| 6,200,002 B1 | 3/2001 | Marshall et al. | |
| 6,220,722 B1 * | 4/2001 | Begemann | 362/231 |
| 6,234,645 B1 * | 5/2001 | Borner et al. | 362/231 |
| 6,234,648 B1 * | 5/2001 | Borner et al. | 362/235 |
| 6,257,737 B1 * | 7/2001 | Marshall et al. | 362/231 |
| 6,357,889 B1 * | 3/2002 | Duggal et al. | 362/84 |
| 6,462,669 B1 | 10/2002 | Pederson | |
| 6,601,970 B2 * | 8/2003 | Ueda et al. | 362/225 |
| 6,841,804 B1 * | 1/2005 | Chen et al. | 257/98 |
| 6,871,993 B2 * | 3/2005 | Hecht | 362/555 |
| 6,976,769 B2 * | 12/2005 | McCullough et al. | 362/345 |
| 7,188,984 B2 | 3/2007 | Sayers et al. | |
| 7,249,877 B2 * | 7/2007 | Johnson et al. | 362/545 |
| 7,252,405 B2 * | 8/2007 | Trenchard et al. | 362/235 |
| 7,314,291 B2 * | 1/2008 | Tain et al. | 362/294 |
| 7,413,326 B2 * | 8/2008 | Tain et al. | 362/294 |
| 7,461,952 B2 * | 12/2008 | Trenchard et al. | 362/294 |
| 7,530,712 B2 * | 5/2009 | Lin et al. | 362/247 |
| 7,654,702 B1 * | 2/2010 | Ding et al. | 362/294 |
| 7,745,840 B2 * | 6/2010 | Wang et al. | 257/95 |
| 7,794,120 B2 * | 9/2010 | Wong et al. | 362/348 |
| 2002/0080622 A1 | 6/2002 | Pashley et al. | |
| 2003/0016536 A1 * | 1/2003 | Lin | 362/250 |
| 2003/0189832 A1 | 10/2003 | Rizkin et al. | |
| 2004/0001344 A1 * | 1/2004 | Hecht | 362/555 |
| 2004/0223338 A1 | 11/2004 | Koike et al. | |
| 2005/0068777 A1 | 3/2005 | Popovic | |
| 2005/0122742 A1 | 6/2005 | Ho | |
| 2005/0169006 A1 | 8/2005 | Wang et al. | |
| 2006/0001384 A1 * | 1/2006 | Tain et al. | 315/246 |
| 2006/0028814 A1 | 2/2006 | Smith | |
| 2006/0061988 A1 * | 3/2006 | Johnson et al. | 362/227 |
| 2006/0250801 A1 * | 11/2006 | Trenchard et al. | 362/294 |
| 2007/0064425 A1 * | 3/2007 | Frecska et al. | 362/253 |
| 2007/0159828 A1 * | 7/2007 | Wang | 362/294 |
| 2007/0230172 A1 * | 10/2007 | Wang | 362/249 |
| 2008/0025047 A1 | 1/2008 | Speier et al. | |
| 2008/0062682 A1 | 3/2008 | Hoelen et al. | |
| 2008/0080192 A1 | 4/2008 | Ruud et al. | |
| 2008/0278943 A1 * | 11/2008 | Van Der Poel | 362/240 |
| 2009/0040770 A1 * | 2/2009 | Lo | 362/327 |
| 2009/0046464 A1 | 2/2009 | Liu et al. | |
| 2009/0244893 A1 * | 10/2009 | Villard | 362/246 |
| 2009/0244903 A1 * | 10/2009 | Wong et al. | 362/308 |
| 2010/0008085 A1 * | 1/2010 | Ivey et al. | 362/218 |
| 2010/0046230 A1 * | 2/2010 | Ding et al. | 362/294 |
| 2010/0097794 A1 * | 4/2010 | Teng et al. | 362/231 |
| 2010/0296266 A1 * | 11/2010 | Dussault et al. | 362/84 |
| 2010/0327768 A1 * | 12/2010 | Kong et al. | 315/294 |
| 2011/0037388 A1 * | 2/2011 | Lou et al. | 315/35 |

FOREIGN PATENT DOCUMENTS

| | | |
|---|---|---|
| DE | 203 19 640 | 4/2004 |
| DE | 10 2004 018 957 | 11/2004 |
| DE | 20 2008 004561 | 6/2008 |
| EP | 1 298 383 | 4/2003 |
| EP | 1900998 | 9/2008 |
| JP | 2004 039594 | 2/2004 |
| JP | 2004 296249 | 10/2004 |
| WO | WO 01/24583 | 4/2001 |
| WO | WO 2006/032662 | 3/2006 |

OTHER PUBLICATIONS

Chang C.-M. et al.: "Design of illumination and projection optics for projectors with single digital micromirror devices", Applied Optics, vol. 39, pp. 3202-3208 (2000).

Geissler E.: "Meeting the Challenges of Developing LED-based Projection displays" Proc. of SPIE vol. 6196, pp. 619601-1-619601-12 (2007).

Giel B. V. et al.: "Using a fly's eye integrator in efficient illumination engines with multiple lightemitting diode light sources", Optical Engineering vol. 46(4), pp. 043001-1-043001-6, Apr. 2007.

Harbers G. et al.: "High power LED illuminators for data and video projector", Proceeding of Internal Display Workshop (IDW, 2002), pp. 501-504.

Harbers G. et al.: "Performance of High Power LED Illuminators in Color Sequential Projection Displays", Proceeding of Internal Display Workshop (IDW, 2003).

Hornbeck L. J.: "Digital Light Processing for High-Brightness, High-Resolution Applications", SPIE vol. 3013 (1997), pp. 27-40.

Keuper M. H. et al.: "RGB LED Illuminator for Pocket-sized Projectors", SID '04 International Symposium Digest of Technical Papers (Society for Information Display, Santa Ana, Calif.), (2004) pp. 943-945.

King C. R. et al.: "Out-of-Plane Refractive Microlens Fabricated by Surface Micromachining", IEEE Photonics Technology Letters, vol. 8, No. 10, Oct. 1996, pp. 1349-1351.

Koehler U. et al.: "Fabrication of microlenses by plasmaless isotropic etching combined with plastic moulding", Sensors and Actuators A 53, (1996) pp. 361-363.

Meuret Y. et al.: "Efficient illumination in LED based projection systems using lenslet integrators", Proc. of SPIE vol. 6196, pp. 619605-1-619605-10 (2006).

Moss G. H. et al.: "A High-Luminance Large-Screen Projector System Using the Digital Micromirror Device (DMD)", in SID '96 International Symposium Digest of Technical Papers (Society for Information Display, Santa Ana, Calif.), pp. 907-910 (1996).

Schreiber P. et al.: "Homogeneous LED illumination using microlens arrays" Proc. of SPIE vol. 5942, pp. 59420K-1-59420K-9 (2005).

Schreiber P. et al.: "Microoptics for homogeneous LED-illumination", Proc. of SPIE vol. 6196, pp. 61960P-1-61960P-10 (2006).

Schulze J. et al.: "Parallel optical interconnection using self-adjusting microlenses on injection molded ferrules made by LIGA technique" Part of the EUROPTO Conference on Design and Engineering of Optical Systems Berlin, Germany, May 1999, SPIE vol. 3737, pp. 562-571.

Sinzinger S. et al.: "Microoptics" John Wiley (2003); pp. 42-46; 56-63; 240-243; 247-272; 356-364.

Stupp E. H. et al.: "Projection Displays" John Wiley & Sons, Chichester (1999); pp. 75; 168; 220-234; 261-269; 307-317.

P. Ruther et al. "Fabrication and characterization of microlenses realized by a modified LIGA process" Pure Appl. Opt. 6 (1997), pp. 643-653, PII: S0963-9659(97)86782-7, IOP Publishing Ltd.

* cited by examiner

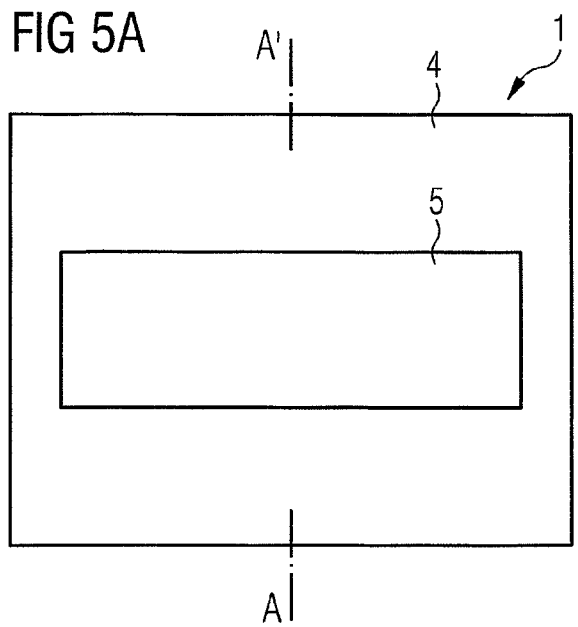
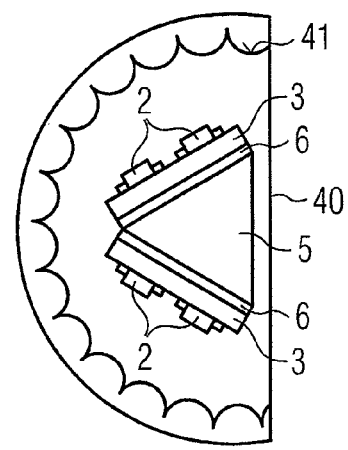
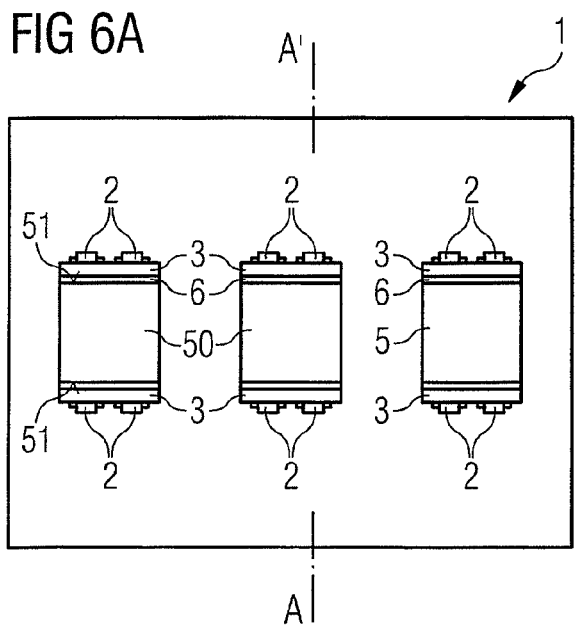
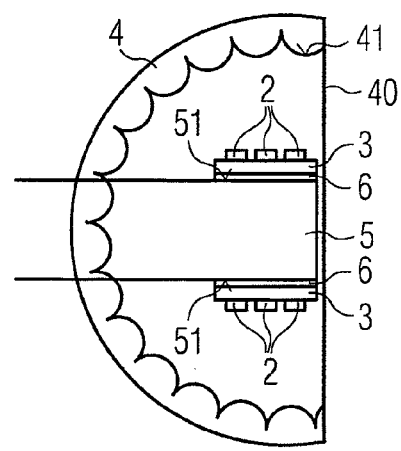

OPTOELECTRONIC MODULE

RELATED APPLICATIONS

This is a U.S. National Phase Application under 35 USC 371 of International Application PCT/EP2010/051724 filed on Feb. 11, 2010.

This application claims priority of German application no. 10 2009 010 213.2 filed Feb. 23, 2010, the entire content of which is hereby incorporated by reference.

FIELD OF THE INVENTION

The present application relates to an optoelectronic module, in particular for general lighting purposes.

BACKGROUND OF THE INVENTION

LED modules for general lighting purposes often exhibit comparatively severe non-uniformities in their emission characteristics, which may relate in particular to the colour location and luminance of the radiation emitted.

SUMMARY OF THE INVENTION

One object is to provide an optoelectronic module which makes it simpler to achieve uniform emission by the module.

According to one embodiment, an optoelectronic module comprises a reflector with an aperture and a structured reflector surface and at least two connection carriers, on each of which there is arranged at least one component provided for producing radiation, in particular in the visible spectral range. The connection carriers are arranged at least partially in the interior of the reflector. At least two components of the module exhibit different emission characteristics when the module is in operation, in particular in terms of spectral and/or spatial emission and/or the luminance of the emitted radiation. Main emission directions are assigned to each of the at least two components. The radiation emitted by the components in their respective main emission directions is deflected at least in part in the direction of the aperture by means of the structured reflector surface.

Only after deflection at the structured reflector surface, for instance resulting from reflection and/or diffraction, does the radiation predominantly exit from the optoelectronic module, in particular in a proportion of at least 50%. The radiation emitted by the components may thus be efficiently intermixed by means of the structured reflector surface in such a way that the radiation exiting from the aperture, in particular in the far field of the optoelectronic module, exhibits a high degree of uniformity. The greater the intermixing of the radiation fractions, the individual components emerge less as individually perceptible radiation sources in the radiation emitted by the optoelectronic module.

The main emission direction of the radiation-emitting components conveniently extends obliquely or perpendicularly to a normal onto the aperture of the reflector. In this way it is simply ensured that the radiation produced by the components exits from the aperture only after impinging on the reflector surface.

The far field is regarded in particular as the emission characteristic of the optoelectronic module at a distance from the aperture which is large relative to the minimum distance of the components from the aperture.

For example, the optoelectronic module may exhibit a high degree of uniformity at a distance of approx. 10 cm from the aperture.

The distance of the components from the aperture preferably amounts to between two times inclusive and twenty times inclusive, particularly preferably between three and ten times inclusive, for example roughly five times, the extent of the radiation exit face of the components.

Uniformity relates in particular to spatially homogen emission by the module in terms of luminance and/or of the colour location of the emitted radiation.

In case of doubt, the interior of the reflector is understood in particular to be the volume which is defined by the reflector surface and the aperture of the reflector.

The connection carriers may in particular be arranged completely in the interior of the reflector. This simplifies mounting of the connection carriers inside the reflector.

Preferably at least two connection carriers are assigned to the reflector, components arranged on the connection carriers emitting radiation in the direction of the reflector. Radiation which is emitted by components on various connection carriers when the optoelectronic module is in operation may thus be intermixed by means of a common reflector and deflected through the aperture of the optoelectronic module. An optoelectronic module, in particular for general lighting purposes, from which the preferably incoherent radiation produced by a plurality of components exits through the aperture with a high degree of uniformity, is thus simply achieved.

In a preferred configuration the at least two components with different emission characteristics are provided for the production of radiation with peak wavelengths in different spectral ranges, in particular different spectral ranges of the visible spectral range. The emission characteristics are thus different from one another at least from a spectral standpoint. The peak wavelengths of the components are preferably selected such that radiation which appears white to the human eye may be produced by intermixing the radiation fractions of the components.

Radiation which appears white may for example be produced by means of one component emitting in the blue spectral range and one emitting in the yellow spectral range. Furthermore, radiation which appears white may also be produced by means of three components, which emit radiation of a suitable colour triad, for example radiation in the red, green and blue spectral ranges.

As an alternative or in addition to the difference in the peak wavelength, the emission characteristics of the components may differ with regard to the intensity of the radiation emitted thereby. A uniform emission characteristic may be achieved for the optoelectronic module by means of the structured reflector surface even in the case of different emitted radiation intensity.

In a preferred configuration the optoelectronic module comprises a mounting body. At least one connection carrier is preferably attached to the mounting body, and particularly preferably at least two connection carriers are attached thereto.

The mounting body is provided in particular to remove the heat generated in the components in operation.

The at least one connection carrier is preferably attached to the mounting body by means of a heat-conducting connecting means. The connecting means may be electrically conductive or electrically insulating.

Suitable connecting means are for example a heat-conducting adhesive, a heat transfer paste or a heat conducting film, for instance a film containing graphite or consisting of graphite.

The mounting body additionally preferably exhibits high thermal conductivity. For example, the mounting body may contain a metal, for instance aluminium or copper, or consist of a metal. A ceramic, for instance aluminium nitride, aluminium oxide or boron nitride, may also be used for the mounting body.

The mounting body may take the form of a solid body, which may additionally lack any internal structure. Such a mounting body is distinguished in particular by ease of production.

In contrast, at least one cavity may also be formed in the mounting body. In particular, the mounting body may enclose a cooling medium.

Such a mounting body may improve dissipation of heat generated in the components out of the components. This may bring about an increase in the efficiency with which radiation is produced. The mounting body may in this case for example take the form of a heat pipe.

Furthermore, the mounting body may fully enclose the cooling medium, so resulting in a closed cooling circuit. Alternatively, the mounting body may be provided with at least one feed line and one outgoing line for the cooling medium.

In a preferred configuration at least two connection carriers are attached to the mounting body. In particular, the mounting body may comprise at least two side faces, to each of which one of the connection carriers of the module is attached. The side faces may in each case form a planar mounting surface for the connection carrier.

Furthermore, two side faces of the mounting body preferably extend obliquely or parallel to one another. Parallel side faces may in particular be provided on opposing sides of the mounting body.

This thus simplifies orientation of the connection carriers, such that the components arranged on these connection carriers emit radiation in different directions. Intermixing of the radiation emitted by the components by means of the structured reflector surface may thus be more simply achieved.

In a preferred configuration a surface normal of at least one side face of the mounting body, on which a connection carrier is arranged, points away from the aperture. In other words, an angle between the surface normal of the side face and the aperture surface preferably amounts to at least 90°. Components arranged on this connection carrier, the main emission direction of which components is perpendicular or substantially perpendicular to the connection carrier, thus emit in such a way that the radiation exits the optoelectronic module through the aperture largely completely or at least predominantly only after reflection at the structured reflector surface. Uniformity of emission by the optoelectronic module is thus increased to a greater extent.

The mounting body preferably exhibits a main axis of extension. The extension of the mounting body along the main axis of extension is preferably at least 1.5 times that in a direction perpendicular to the main axis of extension. The further the mounting body extends along the main axis of extension, the more radiation-emitting components may be arranged adjacent one another in the direction of the main axis of extension. The radiant power which may be generated overall in the optoelectronic module may thus be increased.

In a variant configuration the main axis of extension of the mounting body extends perpendicular or substantially perpendicular to the aperture of the reflector.

In this case side faces of the mounting body, which extend parallel to the main axis of extension, are thus oriented perpendicular or substantially perpendicular to the aperture of the reflector. When the components emit with a main emission direction perpendicular to the side face of the mounting body, emission thus takes place parallel to the aperture of the reflector, such that the radiation exits the aperture predominantly not directly but only after deflection at the reflector.

In a preferred further development, the module comprises a further mounting body with a further main axis of extension. The further main axis of extension of the further mounting body preferably extends parallel or substantially parallel to the main axis of extension of the mounting body. The module may thus comprise a plurality of mounting bodies, which are arranged adjacent one another in a plane extending parallel to the aperture. The mounting bodies may for example be arranged adjacent one another in lines at equidistant or substantially equidistant intervals. This makes it simpler to produce an optoelectronic module which comprises an elongate aperture, for example an aperture with a ratio of length to width of at least 2:1, preferably at least 4:1.

In an alternative variant configuration the main axis of extension of the mounting body extends parallel or substantially parallel to the aperture of the reflector. In this case the connection carrier is preferably attached to a side face of the mounting body whose surface normal points away from the aperture of the reflector.

This simply ensures that the radiation produced in the radiation-emitting components exits the aperture of the optoelectronic module predominantly only after reflection at the structured reflector.

In a preferred configuration the mounting body comprises a cross-section perpendicular to the main axis of extension which has a polygonal basic shape, for example a quadrilateral basic shape with beveled or rounded edges. In the case of a basic shape with n corners the mounting body may comprise n in particular planar side faces, to each of which a connection carrier may be attached in a simplified manner. In particular, a planar side face is particularly suitable for attaching a rigid connection carrier.

The connection carrier preferably takes the form of a circuit board, in particular a printed circuit board. A circuit board of the type FR2 or FR4 is suitable, for example.

Due to its high thermal conductivity a circuit board with a metal core (MCPCB, metal core printed circuit board) is particularly suitable as connection carrier, in particular for mounting radiation-emitting components with a comparatively high power consumption when in operation, for example with a power consumption of 0.2 W or more.

In a further preferred configuration the mounting body is segmented. Segmentation preferably proceeds along the main axis of extension. The segments of the mounting body may each exhibit a similar basic shape or differ from one another at least in part.

The in particular segmented mounting body may be in one piece, i.e. the segments may be made from a single workpiece. Alternatively, a multi-part configuration, in which the mounting body is formed by means of joined-together segments, may also be provided.

A first segment of the mounting body further preferably comprises a side face which is arranged obliquely to a side face of a second segment.

The side faces of the segments, in particular neighbouring segments, may be arranged twisted and/or tilted relative to one another. The main emission directions of the radiation-emitting components arranged on these connection carriers may thus point more simply in different directions. Intermixing of the radiation emitted by the components to make the optoelectronic module's emission uniform is thus simplified to a greater extent.

In a preferred further development the mounting body is formed by means of segments which are of similar construction and are arranged twisted relative to one another with regard to the main axis of extension. The segments may for example each exhibit a cross-section with a polygonal, in particular rectangular, for instance square, basic shape, neighbouring segments being arranged twisted relative to one another with regard to the main axis of extension.

The reflector is preferably constructed such that it has a focus, for instance in the form of a focal point or a focal line. The components are preferably arranged in such a way in the optoelectronic module that they are located in the region of the focus. The more components there are arranged in the vicinity of the focus, the more closely the optoelectronic module's emission through the aperture may be to emission in the form of a purely parallel pencil of rays. For example, the reflector may exhibit, in cross-section at least in places, a circular segment-shaped, elliptical or parabolic basic shape. Furthermore, a curved basic shape of the reflector may be approximated at least in places by suitable straight sub-regions.

The aperture of the reflector, i.e. the radiation exit face of the reflector, may at least in places be curved, for example circular or elliptical, or polygonal, for example rectangular.

In a variant configuration, the reflector structuring is formed by means of structure elements, which may in particular be of similar construction. The structure elements may in particular be curved, for instance concavely or convexly curved. The structure elements may for example take the form of a segment of a sphere. In contrast, the structure elements may each be planar or substantially planar, the normals to neighbouring structure elements pointing appropriately in different directions.

By means of such structuring, intermixing of the radiation emitted by the components to produce uniform total emission by the optoelectronic module may be simply achieved.

The lateral extent of the structure elements is widely variable, the lateral extent being selectable in particular between 10 nm inclusive and 10 cm inclusive.

The structuring may for example take the form of microstructuring, for instance with a lateral extent of at most 50 µm, or of macrostructuring, visible in particular to the human eye.

In a further development the lateral extent of the structure elements lies in the range of the wavelength of the radiation produced by the optoelectronic module. In particular, the lateral extent may amount to between 100 nm inclusive and 1 µm inclusive. In the case of such a lateral extent of the structure elements, optical interference effects may be purposefully used to influence the emission characteristic of the optoelectronic module.

In an alternative variant configuration the reflector is irregularly structured. For example, irregular structuring may be obtained by roughening the reflector. Structuring of the reflector may result in better intermixing at the reflector than is obtained with an unstructured reflector.

The components preferably take the form of surface-mountable components (SMDs or surface-mounted devices), which also each preferably comprise at least one semiconductor chip provided for producing preferably incoherent radiation. Such components are simpler to mount and to contact on the side of the connection carrier remote from the mounting body.

Alternatively, the components may be un-housed semiconductor chips, which are mounted directly on the connection carrier. In this case it is possible to dispense with a prefabricated housing for the semiconductor chip.

BRIEF DESCRIPTION OF THE DRAWINGS

Further features, configurations and expediencies of the optoelectronic module are revealed by the following description of the exemplary embodiments in conjunction with the Figures, in which:

FIGS. 5A and 5B show a fourth exemplary embodiment of an optoelectronic module in schematic plan view (FIG. 5A) and associated sectional view (FIG. 5B), FIGS. 6A and 6B show a fifth exemplary embodiment of an optoelectronic module in schematic plan view (FIG. 6A) and associated sectional view (FIG. 6B)

DETAILED DESCRIPTION OF THE DRAWINGS

Figure 1:
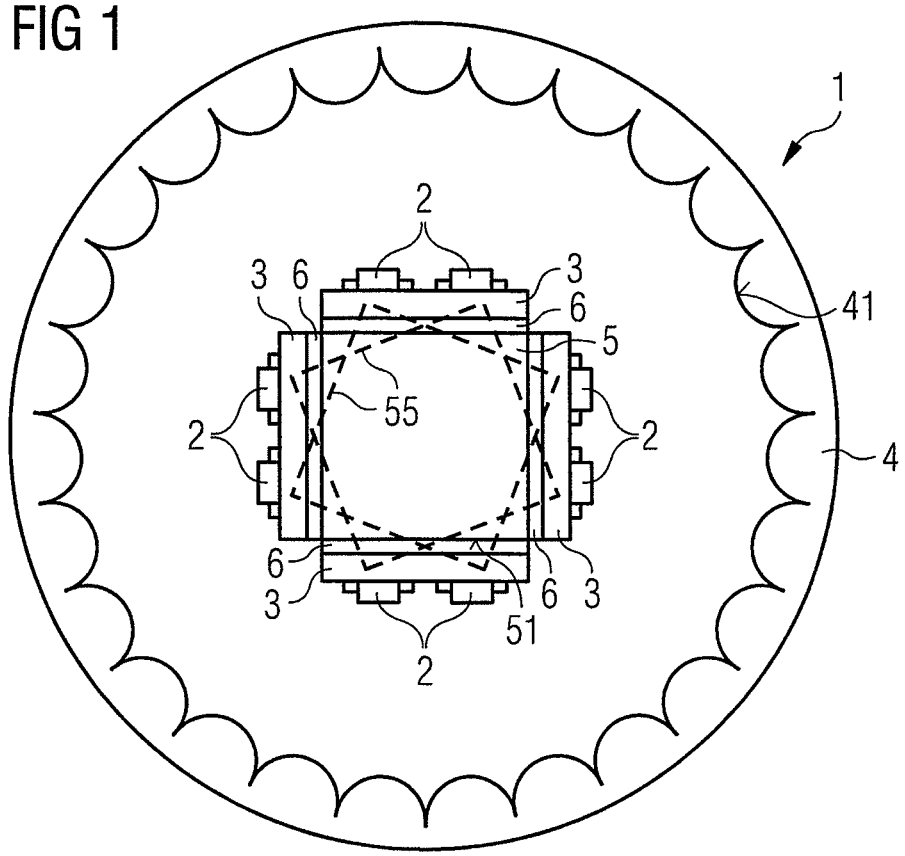
FIG. 1 is a schematic plan view of a first exemplary embodiment of an optoelectronic module.

Identical, similar or identically acting elements are provided with identical reference numerals in the figures.

The figures are in each case schematic representations and are therefore not necessarily true to scale. Rather, comparatively small elements and in particular layer thicknesses may be shown on an exaggeratedly large scale and/or not in the correct ratio to one another to make the illustration clearer.

Figure 2:
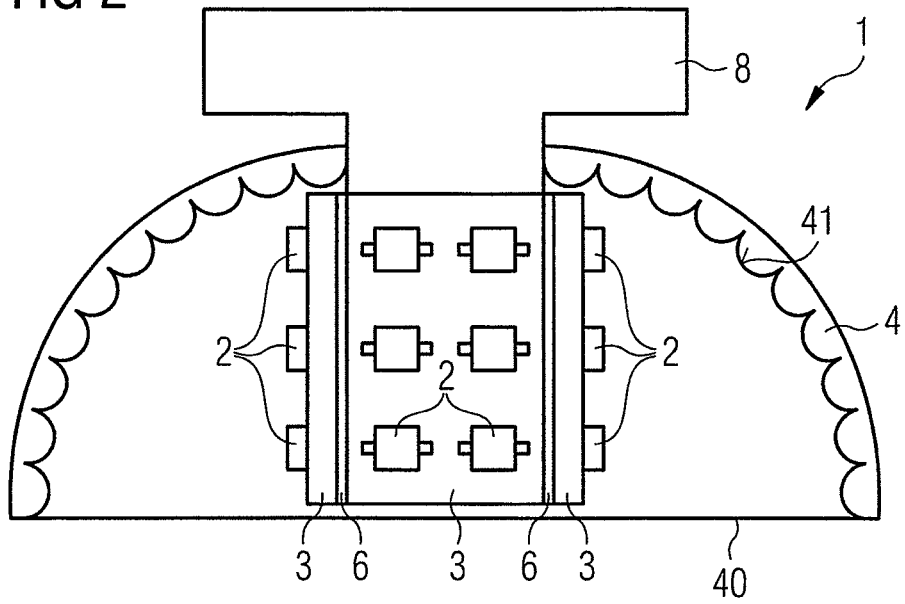
FIG. 2 is a schematic side view of the optoelectronic module according to the first exemplary embodiment shown in FIG. 1.

A first exemplary embodiment of an optoelectronic module is shown in FIG. 1 by means of a schematic plan view and in FIG. 2 by means of a side view. In FIG. 2, for ease of illustration of the elements arranged in the reflector parts of said reflector are not shown.

The optoelectronic module 1 comprises a reflector 4 with a structured reflector surface 41. An aperture 40 of the reflector extends in FIG. 1 parallel to the plane of the drawing.

Furthermore, the optoelectronic module comprises a mounting body 5. The mounting body 5 is surrounded laterally by the reflector surface 41.

A main axis of extension of the mounting body 5 extends parallel, preferably collinearly to a reflector axis perpendicular to the aperture of the reflector.

Connection carriers 3 are attached to the mounting body 5. A plurality of components 2 intended for producing radiation are arranged on the connection carriers 3. The number of components may be varied within broad limits depending on the radiant power to be generated by the optoelectronic module. The connection carriers 3 do not necessarily each have to have the same number of components arranged on them.

The radiation-emitting components each exhibit a main emission direction which extends perpendicular to the connection carriers 3. The components are thus attached in such a way to the mounting body that the radiation emitted by the components predominantly impinges on the reflector surface 41 of the reflector 4 and may exit through the aperture of the reflector after being reflected at least once at this reflector surface.

At least two components of the module exhibit different emission characteristics when the module is in operation, in particular in terms of the peak wavelengths thereof, the emission characteristics of the components preferably being selected such that polychromatic radiation exits from the optoelectronic module, preferably radiation which appears white to the human eye. Such a module is particularly suitable for general lighting purposes.

The optoelectronic module may for example comprise components which emit in the green spectral range, in the red spectral range and in the blue spectral range. The radiation emitted by the components is intermixed by means of the reflector surface 41, in particular by means of the structuring of the reflector surface 41, and deflected towards the aperture of the optoelectronic module. In this way an emission characteristic of the module may be achieved which makes a uniform polychromatic impression on the human eye, in particular a uniform white-impression. The individual components may each produce radiation in just one spectral range. In other words, by means of the structured reflector surface a uniform white-impression, in particular in the far field of the module, may be achieved even with components which themselves each only emit radiation in one spectral range.

In the exemplary embodiment shown, the reflector is structured by means of similar structure elements, which are convexly curved, in particular take the form of a spherical cap or a segment of a sphere.

Different structuring may also be used, for example exhibiting a structure element curvature which is concave at least in places or having planar surfaces each extending obliquely to one another as structure elements.

The structure elements may exhibit a lateral extent of between 10 nm inclusive and 10 mm inclusive and thus take the form of a microstructure or a macrostructure.

In particular, the lateral extent of the structure elements may lie in the range of the wavelength of the radiation emitted by the optoelectronic module. For example, the lateral extent may amount to between 100 nm inclusive and 1 lam inclusive. In this way, optical interference effects may be purposefully used to adjust the emission of the optoelectronic module.

The components of the optoelectronic module 1 are preferably arranged in the region of a focus of the reflector 4. The larger the number of components arranged in the focus or at least in the vicinity of the focus of the reflector, the more strongly the module's emission may be directed, in particular perpendicular or at least at a small angle to the aperture of the reflector. Collimated emission is thus simpler to achieve.

The mounting body 5 of the optoelectronic module may be segmented along the main axis of extension. This is indicated in FIG. 1 by segments 55 shown by dashed lines. As an example of a polygonal cross-section the segments 55 each exhibit a square cross-section. The segments are twisted relative to one another with regard to the main axis of extension of the mounting body. The connection carriers with associated components arranged at the side faces of the segments 55 illustrated by dashed lines are not shown explicitly in FIG. 1 for greater clarity.

The mounting body 5 exhibits expediently high thermal conductivity. For example, the mounting body may contain a metal, for instance aluminium or copper, or consist of a metal. Alternatively or in addition, the mounting body may contain a ceramic, for instance aluminium nitride or boron nitride, or consist of a ceramic.

The mounting body may take the form of a solid body. In contrast, the mounting body may also comprise an internal structure (not shown explicitly), which may for example enclose a cooling medium. The mounting body may for example also take the form of a heat pipe.

The connection carriers 3 are each attached to the side faces 51 of the mounting body 5 by means of a heat-conducting connecting means 6. The connecting means may for example take the form of a heat transfer paste or a heat-conducting film, for example a graphite film.

The connection carriers preferably each take the form of a circuit board. A circuit board of the type FR2 or FR4 is suitable, for example. A circuit board with a metal core (MCPCB) is particularly suitable due to its high thermal conductivity. The heat generated by the components when in operation may in this way be particularly efficiently dissipated through the connection carriers to the mounting body.

LED components are particularly suitable as radiation-emitting components 2.

The LED components preferably take the form of surface-mountable components. Attachment of the components and production of an electrically conductive connection with the respective connection carrier may thus proceed on the side of the connection carrier 3 remote from the mounting body.

The side faces 51 of the mounting body 5 to which the connection carriers 3 are attached each exhibit a surface normal which extends parallel to the aperture. This makes it simpler to ensure that components attached to the respective connection carriers predominantly emit radiation in such a way that the radiation exits the aperture only after reflection at the reflector surface 41 of the reflector 4. Intermixing of the radiation emitted by the components to produce a uniform overall impression at a significant distance from the aperture is thus simplified to a greater extent.

As may be seen in FIG. 2, the optoelectronic module comprises a heat sink 8 arranged outside the reflector 4, to which heat sink the mounting body is attached. The heat sink may absorb heat generated when the module is in operation. In the exemplary embodiment shown, the mounting body 5 extends through the reflector 4.

In contrast, it is however also possible to dispense with this heat sink arranged outside the reflector 4.

Furthermore, the reflector may, unlike in the first exemplary embodiment illustrated, also exhibit other geometric basic shapes. For example, the reflector may have an elliptical basic shape. A configuration of the reflector 4 in the form of a segment of a paraboloid of revolution may also be used.

Figure 3:
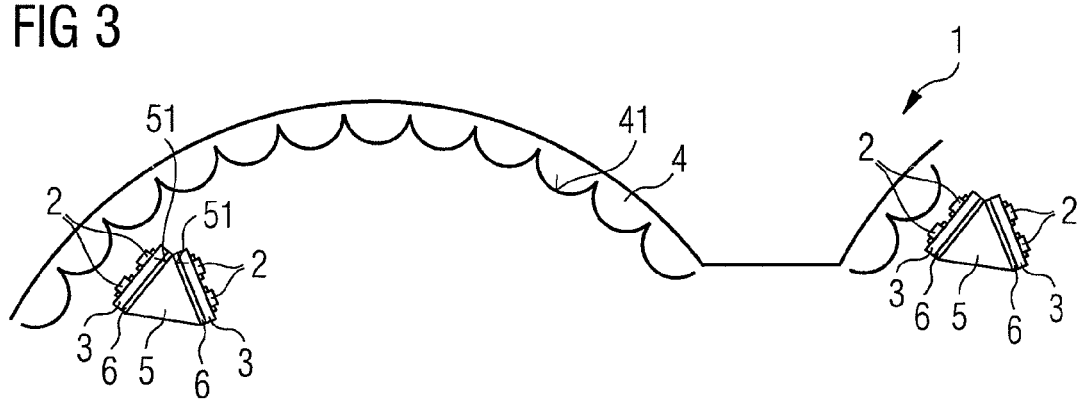
FIG. 3 is a schematic side view of a second exemplary embodiment of an optoelectronic module.

A second exemplary embodiment of an optoelectronic module is illustrated schematically in sectional view in FIG. 3.

This second exemplary embodiment substantially corresponds to the first exemplary embodiment described in relation to FIGS. 1 and 2. Unlike in the first exemplary embodiment, the reflector 4 exhibits a curved shape, the curvature of the reflector varying locally.

Furthermore, unlike in the first exemplary embodiment the mounting body 5 exhibits a triangular basic shape, a connection carrier 3 being attached to each of just two side faces 51 of the mounting body.

These two side faces are those side faces whose surface normal points towards the reflector surface 41 of the reflector 4. The side face of the mounting body 5 whose surface normal points towards the aperture of the reflector does not on the other hand have a connection carrier. This ensures that the components arranged on the connection carriers predominantly emit in such a way that the radiation is initially deflected at the reflector surface before exiting from the aperture of the reflector and in this way is intermixed in particular due to the structuring of the reflector surface. It goes without saying that the mounting body may have a basic shape which deviates from the exemplary embodiment shown, for example a basic shape with four or more corners.

Figure 4:
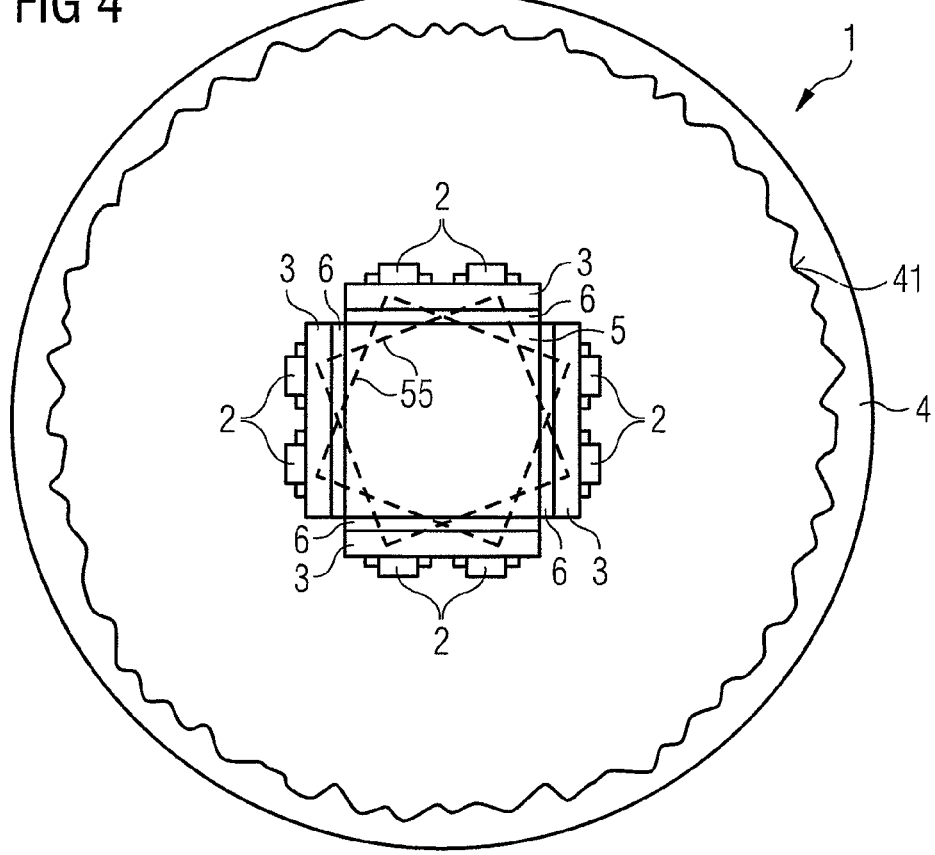
FIG. 4 is a schematic plan view of a third exemplary embodiment of an optoelectronic module.

A third exemplary embodiment of an optoelectronic module is illustrated schematically in sectional view in FIG. 4. This third exemplary embodiment substantially corresponds to the first exemplary embodiment described in connection with FIGS. 1 and 2. Unlike in the first exemplary embodiment, the reflector 4 is irregularly structured. Irregular structuring may be achieved for example by roughening. For example, the main body of the reflector may be roughened and subsequently provided with a highly reflective coating, for example a metallic coating. Alternatively, the main body of the reflector 4 may itself already be highly reflective and structured by roughening.

A reflector surface structured in this way is easy to produce.

A fourth exemplary embodiment of an optoelectronic module is shown in FIGS. 5A and 5B in schematic plan view (FIG. 5A) and associated sectional view along line AA' (FIG. 5B).

This exemplary embodiment substantially corresponds to the first exemplary embodiment described in relation to FIGS. 1 and 2. Unlike in the first exemplary embodiment the mounting body 5 has a triangular basic shape, as described in relation to FIG. 3.

It goes without saying that another basic shape, in particular polygonal, for example quadrangular, may in contrast also be used.

Furthermore, unlike in the first exemplary embodiment the aperture 40 is elongate, in particular rectangular.

To improve clarity, in the plan view only the mounting body 5 is shown, and not the connection surfaces 3 attached to the mounting body and the associated components 2.

A main axis of extension of the mounting body 5 extends along a focal line of the reflector 4. The focal line extends parallel to the aperture 40 of the optoelectronic module, i.e. perpendicular to the section plane of FIG. 5B.

The main axis of extension of the mounting body thus extends parallel to the aperture of the reflector.

The connection carriers 3 are in turn in each case oriented relative to the reflector 4, in particular to the aperture 40, in such a way that the components 2 arranged on the connection carriers 3 each exhibit a main axis of extension which exhibits an angle of at least 90° to the aperture of the reflector.

This ensures that the emitted radiation impinges initially predominantly on the reflector surface 41 and exits the aperture 40 only after intermixing at the reflector surface. In this way an optoelectronic module may be produced in which the radiation exiting through an elongate aperture exhibits a high degree of uniformity in the far field.

A fifth exemplary embodiment of an optoelectronic module is shown in FIGS. 6A and 6B in schematic plan view (FIG. 6A) and associated sectional view along line AA' (FIG. 6B).

This fifth exemplary embodiment corresponds substantially to the first exemplary embodiment described in relation to FIGS. 1 and 2, the aperture of the optoelectronic module, as described in relation to FIGS. 5A and 5B, being of elongate construction.

Unlike in the fourth exemplary embodiment described in relation to FIGS. 5A and 5B, in addition to the mounting body 5 the optoelectronic module 1 additionally comprises two further mounting bodies 50. The mounting bodies 5, 50 each have main axes of extension which extend perpendicular to the aperture of the optoelectronic module and moreover parallel to one another. Connection carriers 3 with components 2 attached thereto are arranged on the mounting bodies 5 in each case on two opposing mounting surfaces 51.

The normals of the side faces each extend parallel to the aperture of the reflector 4.

The mounting bodies 5, 50 are in this case arranged adjacent one another along a focal line of the reflector 4. This allows simplified achievement of an emission characteristic in which the radiation exits the optoelectronic module after reflection at the structured reflector surface 41 predominantly at a comparatively small angle to a normal onto the aperture 40 of the reflector 4.

Figure 7:
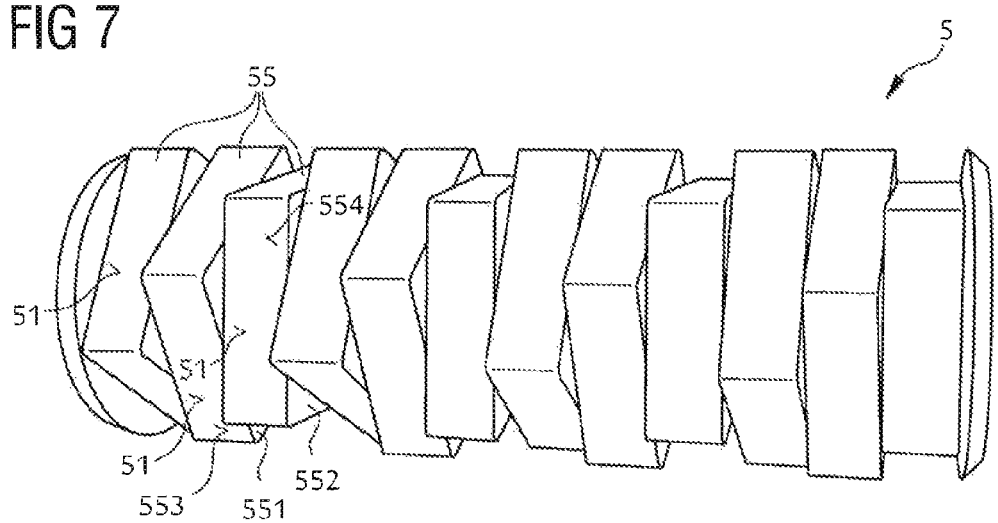
FIG. 7 shows an exemplary embodiment of a mounting body.

An exemplary embodiment of a mounting body is shown in perspective schematic representation in FIG. 7.

The mounting body 5 comprises a plurality of segments 55, which adjoin one another along a main axis of extension of the mounting body. The segments 55 are each of similar construction and, in the exemplary embodiment shown, each exhibit a cross-sectionally square basic shape, the resultant cuboids of the segments 55 each exhibiting beveled edges.

The mounting body 5 is preferably of one-piece construction. In contrast, the mounting body may also be of multi-part construction.

Two neighbouring segments, for example a first segment 551 and a second segment 552, are each arranged twisted relative to one another with regard to the main axis of extension. A side face 553 of the first segment 551 is thus positioned obliquely to a side face 554 of the second segment 552. Unlike in the exemplary embodiment shown, the side faces 51 of the segments may alternatively or additionally also be tilted relative to one another.

Figure 8:
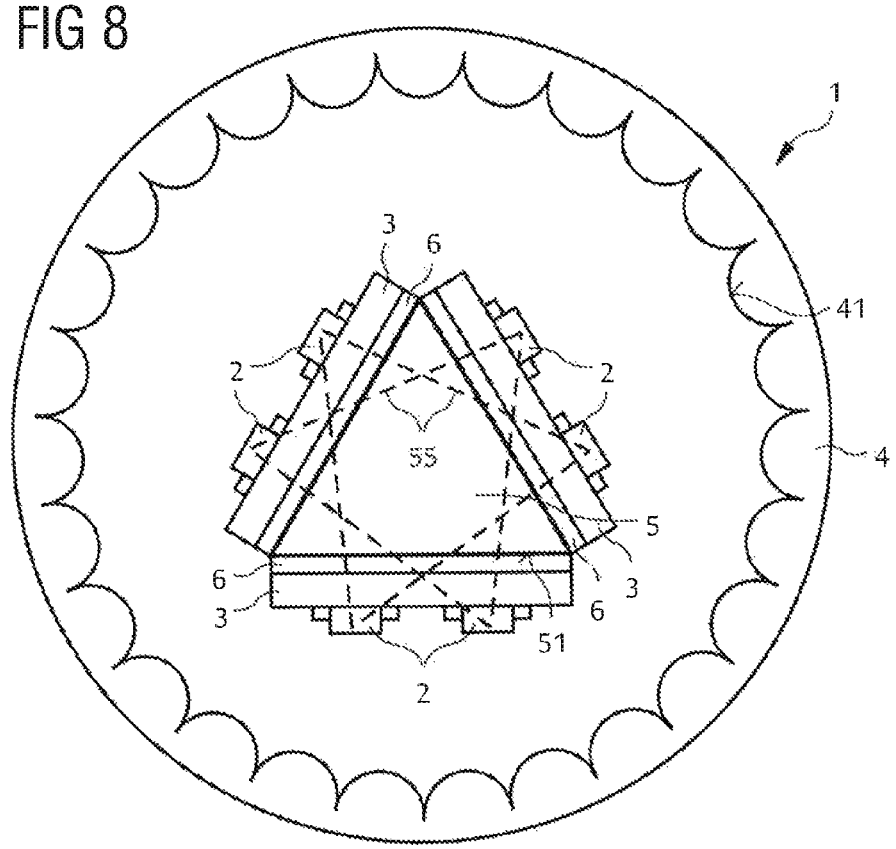
FIG. 8 is a schematic plan view of a sixth exemplary embodiment of an optoelectonic module.
Figure 9:
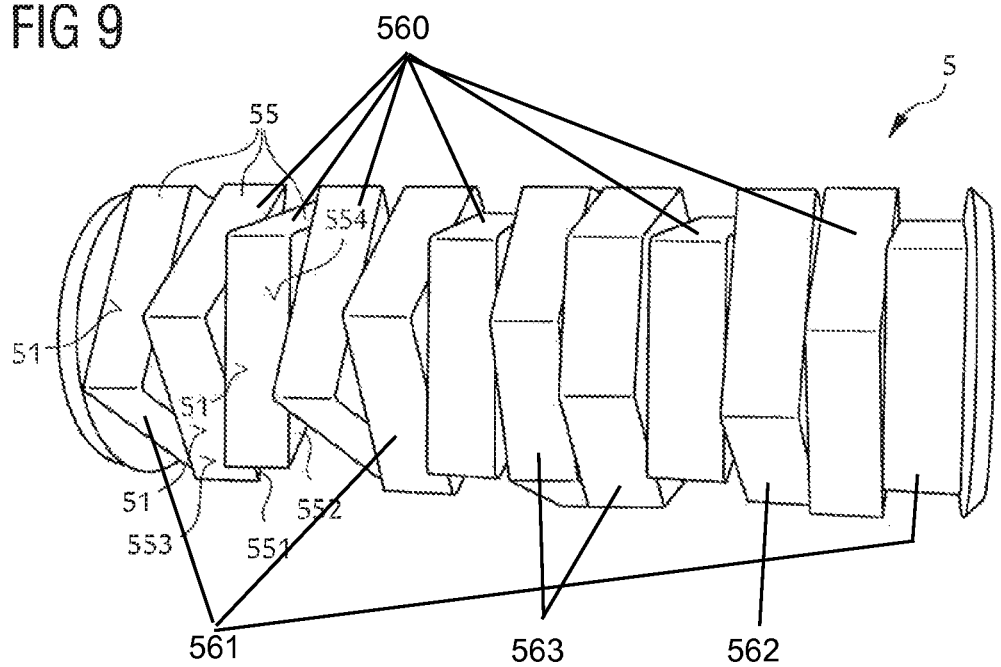
FIG. 9 is an exemplary embodiment of a mounting body.

The side faces 51 of the segments 55 are preferably each of planar construction. Attachment of in particular rigid connection carriers is simplified thereby. It goes without saying that the segments may also have a different cross-sectional basic shape, in particular a polygonal basic shape with a number of corners different from four, for example with three, five or six corners. An exemplary embodiment of an optoeletronic module with a triangular shape mounting body 5 placed within a reflector 4 is shown in the schematic plan view of FIG. 8. An exemplary embodiment is shown in FIG. 9 of a mounting body 5 in a perspective schematic representation showing segments with three corners 560, four corners 561, five corners 562, and six corners 563.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:
1. An optoelectronic module comprising:
a plurality of components configured to produce radiation;
a reflector having:
  an aperture; and
  a structured reflector surface; and
a plurality of connection carriers, on each of which there are arranged at least two of the plurality of components configured to produce radiation, and
a mounting body that comprises a main axis of extension which extends substantially perpendicular to the aperture of the reflector,
wherein the plurality of connection carriers is arranged at least partially in an interior of the reflector;
wherein at least two of the plurality of components configured to produce radiation of the module exhibit different emission characteristics when the module is in operation, a main emission direction being assigned to each of the at least two components;
wherein the radiation emitted by the plurality of components configured to produce radiation in their respective main emission directions are deflected at least in part towards the aperture by the structured reflector surface,
wherein the structured reflector surface is structured by convexly curved structure elements that are segments of a sphere, the structure elements exhibit a lateral extent of between 100 nm inclusive and 1 μm inclusive, wherein the mounting body is segmented along the main axis of extension and comprises at least four segments, wherein the segments each exhibit a polygonal cross-section and at least three side faces, the segments being twisted relative to one another with regard to the main axis of extension of the mounting body such that at least one segment comprises at least one side face which is oblique to a side face of a second segment, and wherein to each of said at least three side faces of each segment a connection carrier of the plurality of connection carriers is attached.

2. The optoelectronic module according to claim 1, wherein the at least two components configured to produce radiation produce radiation with peak wavelengths in different spectral ranges.

3. The optoelectronic module according to claim 1, wherein the mounting body encloses a cooling medium.

4. The optoelectronic module according to claim 1, wherein a surface normal of one side face of the mounting body, on which at least one component of the at least two components configured to produce radiation is arranged, points away from the aperture.

5. The optoelectronic module according to claim 1, wherein the module comprises a further mounting body with a further main axis of extension, which extends one of parallel and substantially parallel to the main axis of extension of the mounting body.

6. The optoelectronic module according to claim 1, wherein, perpendicular to a main axis of extension, the mounting body has a polygonal cross-section.

7. The optoelectronic module according to claim 1, wherein the reflector exhibits a focus and the at least two components configured to produce radiation are arranged in the region of the focus.

8. The optoelectronic module according to claim 1, wherein the reflector is structured by similar structure elements.

9. The optoelectronic module according to claim 1, wherein the reflector is irregularly structured.

10. The optoelectronic module according to claim 1, wherein each side face of each segment has a surface normal pointing towards the reflector surface of the reflector.

11. An optoelectronic module comprising:
a plurality of components configured to produce radiation;
a reflector having:
an aperture; and
a structured reflector surface;
a plurality of connection carriers, on each of which there are arranged at least two of the plurality of components configured to produce radiation, and
a mounting body that comprises a main axis of extension which extends substantially perpendicular to the aperture of the reflector,
wherein the plurality of connection carriers is arranged at least partially in an interior of the reflector;
wherein at least two of the plurality of components configured to produce radiation of the module exhibit different emission characteristics when the module is in operation, a main emission direction being assigned to each of said at least two components;
wherein the radiation emitted by the plurality of components configured to produce radiation in their respective main emission directions are deflected at least in part towards the aperture by the structured reflector surface,
wherein the structured reflector surface is structured by convexly curved structure elements that are segments of a sphere, the structure elements exhibit a lateral extent of between 100 nm inclusive and 1 µm inclusive,
wherein the mounting body is segmented along a main axis of extension and comprises at least four segments,
wherein the segments each exhibit a quadrilateral basic shape and four side faces, the segments being twisted relative to one another with regard to the main axis of extension of the mounting body such that at least one segment comprises at least one side face which is oblique to a side face of a second segment, and
wherein to each of said four side faces of each segment a connection carrier of the plurality of connection carriers is attached.

* * * * *